(12) United States Patent
Fujita et al.

(10) Patent No.: US 11,515,643 B2
(45) Date of Patent: *Nov. 29, 2022

(54) ELECTROMAGNETIC-WAVE-ABSORBING SHEET

(71) Applicant: Maxell, Ltd., Kyoto (JP)

(72) Inventors: Masao Fujita, Kyoto (JP); Toshio Hiroi, Kyoto (JP)

(73) Assignee: MAXELL, LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/473,450

(22) Filed: Sep. 13, 2021

(65) Prior Publication Data

US 2021/0408695 A1    Dec. 30, 2021

Related U.S. Application Data

(62) Division of application No. 16/347,416, filed as application No. PCT/JP2017/039696 on Nov. 2, 2017, now Pat. No. 11,152,711.

(30) Foreign Application Priority Data

Nov. 4, 2016   (JP) ................................. 2016-216290

(51) Int. Cl.
    *H05K 9/00*     (2006.01)
    *H01Q 17/00*    (2006.01)
    *H01F 1/375*    (2006.01)

(52) U.S. Cl.
    CPC ............. *H01Q 17/00* (2013.01); *H01F 1/375* (2013.01); *H05K 9/00* (2013.01); *H05K 9/0081* (2013.01)

(58) Field of Classification Search
    CPC ............................. H05K 9/0083; H01Q 17/00
    See application file for complete search history.

(56) References Cited

U.S. PATENT DOCUMENTS 5,275,880 A     1/1994  Boyer, III et al.
11,152,711 B2 * 10/2021 Fujita ................... H05K 9/0075
                        (Continued)

FOREIGN PATENT DOCUMENTS

EP   3478046 A1   5/2019
JP   4-10595 A    1/1992
                  (Continued)

OTHER PUBLICATIONS

Extended European Search Report, dated Jun. 5, 2020, for European Application No. 17867558.3.

(Continued)

*Primary Examiner* — Hung V Ngo
(74) *Attorney, Agent, or Firm* — Birch, Stewart, Kolasch & Birch, LLP

(57) ABSTRACT

An electromagnetic wave absorbing sheet is provided that can adequately absorb electromagnetic waves at high frequencies in and above the millimeter wave band, can have excellent flexibility, and can easily be placed in any desired portion.

The electromagnetic wave absorbing sheet includes an electromagnetic wave absorbing layer 1 containing a magnetic iron oxide 1a that magnetically resonates at frequencies in and above the millimeter wave band and a resin binder 1b. The electromagnetic wave absorbing sheet absorbs radiated electromagnetic waves by magnetic resonance of the magnetic iron oxide. The electromagnetic wave absorbing sheet has a flexibility evaluation value F (g/mm$^2$) of more than 0 and 6 or less, which is determined by measuring an applied weight (g) that is required to bend a ribbon-like electromagnetic wave absorbing sheet in the elastic deformation region so that a distance d between the inner surfaces of the ribbon-like sheet at a position L spaced 10 mm from the bent (Continued)

portion of the ribbon-like sheet is 10 mm, and dividing the applied weight (g) by a cross-sectional area D (mm$^2$) of the ribbon-like sheet.

3 Claims, 5 Drawing Sheets

(56) References Cited

U.S. PATENT DOCUMENTS

| | | |
|---|---|---|
| 2003/0044623 A1 | 3/2003 | Sakurai et al. |
| 2005/0030218 A1 | 2/2005 | Kondo et al. |
| 2007/0229346 A1 | 10/2007 | Okada |
| 2009/0261919 A1 | 10/2009 | Takeda |
| 2010/0238063 A1 | 9/2010 | Ohkoshi et al. |
| 2016/0164187 A1 | 6/2016 | Ohkoshi et al. |
| 2017/0349448 A1 | 12/2017 | Ohkoshi et al. |
| 2019/0215994 A1 | 7/2019 | Hiroi et al. |
| 2019/0269048 A1 | 8/2019 | Fujita et al. |

FOREIGN PATENT DOCUMENTS

| | | |
|---|---|---|
| JP | 10-117084 A | 5/1998 |
| JP | 11-354972 A | 12/1999 |
| JP | 2003-332783 A | 11/2003 |
| JP | 2004-6436 A | 1/2004 |
| JP | 2004-186371 A | 7/2004 |
| JP | 2005-57093 A | 3/2005 |
| JP | 2005-158960 A | 6/2005 |
| JP | 2006-73949 A | 3/2006 |
| JP | 2007-250823 A | 9/2007 |
| JP | 2008-21990 A | 1/2008 |
| JP | 2008-60484 A | 3/2008 |
| JP | 2008-277726 A | 11/2008 |
| JP | 2009-124691 A | 6/2009 |
| JP | 2009-188322 A | 8/2009 |
| JP | 2009-224414 A | 10/2009 |
| JP | 2010-245112 A | 10/2010 |
| JP | 2011-233834 A | 11/2011 |
| JP | 2012-129352 A | 7/2012 |
| JP | 2013-4854 A | 1/2013 |
| JP | 2013-201359 A | 10/2013 |
| JP | 2014-78698 A | 5/2014 |
| JP | 2016-111172 A | 6/2016 |
| JP | 2016-111341 A | 6/2016 |
| JP | 2016-135737 A | 7/2016 |

OTHER PUBLICATIONS

Extended European Search Report, dated Oct. 16, 2020, for European Application No. 17866650.9.
International Search Report for PCT/JP2017/039697 dated Feb. 6, 2018.
International Search Report, issued in PCT/JP2017/039696, PCT/ISA/210, dated Feb. 6, 2018.
Japanese Office Action dated Oct. 17, 2019, for corresponding Japanese Application No. 2018-223589.
Japanese Office Action dated Oct. 17, 2019, for corresponding Japanese Application No. 2018-234317.
Japanese Office Action, dated Arp. 14, 2020, for Japanese Application No. 2018-223589, with an English translation.
Japanese Office Action, dated Jul. 13, 2021, for Japanese Application No. 2020-076746, with an English machine translation.
Partial European Search Report, dated May 29, 2020, for European Application No. 17866650.9.
"Characteristics of Silicone Rubber (VMQ, PVMQ, FVMQ) | Physical Properties of Silicone Rubber, such as Components, Applications, Specific Gravity, Heat Resistance, Hardness, and Chemical Resistance," updated Aug. 26, 2011, 4 pages total, with an English translation.
"Components, Uses, Characteristics, Physical Properties (Specific Gravity, Heat Resistance, Hardness), and Chemical Resistance of Acrylic Rubber (ACM)," updated Aug. 26, 2011, 3 pages total, with an English translation.
Japanese Notice of Reasons for Revocation for Japanese Patent No. 6697063, dated Mar. 16, 2021, with an English translation.
Japanese Notice of Reasons for Revocation for Japanese Patent No. 6697063, dated Nov. 11, 2021, with an English translation.
Kurahashi et al., "The development research of the ferrite type radio absorptive material which has an absorption characteristic at the 76 GHz band," Ehime Prefectural Industrial Research Report, No. 45, 2007, 31 pages total, with an English translation.
Ohkoshi et al., "Succeeded in developing millimeter-wave absorbing magnetic material for 150 GHz (gigahertz) or higher," Angewandte Chemie International Edition, Oct. 25, 2007, (published online Oct. 17, 2007), 7 pages total, with an English translation.

* cited by examiner (a)

(b)

ELECTROMAGNETIC-WAVE-ABSORBING SHEET

CROSS-REFERENCE TO RELATED APPLICATIONS

This application is a Divisional application of co-pending application Ser. No. 16/347,416, filed on May 3, 2019, which is the National Phase under 35 U.S.C. § 371 of International Application No. PCT/JP2017/039696, filed on Nov. 2, 2017, which claims the benefit under 35 U.S.C. § 119(a) to Patent Application No. 2016-216290, filed in Japan on Nov. 4, 2016, all of which are hereby expressly incorporated by reference into the present application.

TECHNICAL FIELD

The present disclosure relates to an electromagnetic wave absorbing sheet for absorbing electromagnetic waves. In particular, the present disclosure relates to an electromagnetic wave absorbing sheet that has excellent flexibility, includes a magnetic material that absorbs electromagnetic waves by magnetic resonance, and absorbs electromagnetic waves at high frequencies in and above the millimeter wave band.

BACKGROUND ART

Electromagnetic wave absorbing sheets have been used to avoid the influence of leakage electromagnetic waves, which are emitted from, e.g., electric circuits to the outside, or undesirable reflected electromagnetic waves.

In recent years, centimeter waves with frequencies of several gigahertz (GHz) have been used in, e.g., mobile communications such as mobile phones, wireless LAN, and electronic toll collection (ETC) systems. Moreover, studies have made progress on the technology using electromagnetic waves not only in the millimeter wave band from 30 GHz to 300 GHz, but also in a higher frequency band than the millimeter wave band, corresponding to a frequency of 1 terahertz (THz).

According to the technical trend toward electromagnetic waves with higher frequencies, electromagnetic wave absorbers for absorbing unwanted electromagnetic waves as well as the electromagnetic wave absorbing sheets are increasingly required to be able to absorb electromagnetic waves at frequencies between GHz and THz.

As an example of the electromagnetic wave absorber that absorbs electromagnetic waves at higher frequencies, Patent Document 1 proposes an electromagnetic wave absorber that has a packed structure of particles having an epsilon iron oxide ($\varepsilon$-$Fe_2O_3$) crystal as the magnetic phase. This electromagnetic wave absorber exhibits electromagnetic wave absorption performance in the range of 25 GHz to 100 GHz. Patent Document 2 proposes a sheet-like oriented body. The sheet-like oriented body is produced by mixing fine particles of epsilon iron oxide with a binder, and drying and curing the binder while an external magnetic field is applied, so that the magnetic field orientation of the epsilon iron oxide particles can be improved.

PRIOR ART DOCUMENTS

Patent Documents

Patent Document 1: JP 2008-60484 A
Patent Document 2: JP 2016-135737A

DISCLOSURE OF INVENTION

Problem to be Solved by the Invention

When predetermined electronic circuit components are shielded from leakage electromagnetic waves from a source that emits electromagnetic waves, or protected from unexpected reflected waves or externally incident electromagnetic waves, an electromagnetic wave absorbing material should be provided to cover the circuit components to be protected. In this case, it is often easier to attach the electromagnetic wave absorbing material to the outer or inner surface of the existing member such as a case of electronic equipment that houses the circuit components to be protected than to form the electromagnetic wave absorbing material into a shape that covers the circuit components to be protected.

As described above, if the circuit components to be protected are surrounded by the electromagnetic wave absorbing material using the existing member, it is very important that the electromagnetic wave absorbing material is closely arranged without any space. Moreover, if the electromagnetic wave absorbing material is placed on a curved surface, an electromagnetic wave absorbing sheet is more useful than a solid electromagnetic wave absorber because the former can easily follow the curved surface. When the electromagnetic wave absorbing sheet is closely arranged, it may sometimes need to be rearranged so as not to leave any space. Thus, there is a possibility that the electromagnetic wave absorbing sheet that has been sticking to a surface will be forcibly peeled off and can be very distorted. Therefore, the electromagnetic wave absorbing sheet should be flexible enough to withstand such a rearrangement. However, the conventional electromagnetic wave absorbing material that can absorb electromagnetic waves at high frequencies in and above the millimeter wave band does not have sufficient flexibility even if it is in the form of a sheet.

In view of the demand for the electromagnetic wave absorbing sheet, it is an object of the present disclosure to provide an electromagnetic wave absorbing sheet that can adequately absorb electromagnetic waves at high frequencies in and above the millimeter wave band, can have excellent flexibility, and can easily be placed in any desired portion.

Means for Solving Problem

To solve the above problem, an electromagnetic wave absorbing sheet of the present disclosure includes an electromagnetic wave absorbing layer containing a magnetic iron oxide that magnetically resonates at frequencies in and above a millimeter wave band and a resin binder. The electromagnetic wave absorbing sheet absorbs radiated electromagnetic waves by magnetic resonance of the magnetic iron oxide. The electromagnetic wave absorbing sheet has a flexibility evaluation value F ($g/mm^2$) of more than 0 and 6 or less, which is determined by measuring an applied weight (g) that is required to bend a ribbon-like electromagnetic wave absorbing sheet in an elastic deformation region so that a distance d between inner surfaces of the ribbon-like sheet at a position L spaced 10 mm from a bent portion of the ribbon-like sheet is 10 mm, and dividing the applied weight (g) by a cross-sectional area D ($mm^2$) of the ribbon-like sheet.

Effects of the Invention

The electromagnetic wave absorbing sheet of the present disclosure includes a magnetic iron oxide that magnetically resonates at frequencies in and above the millimeter wave band, and has a flexibility evaluation value F of more than 0 and 6 or less. Thus, the electromagnetic wave absorbing sheet is highly practicable and can have high flexibility and electromagnetic wave absorption properties to absorb electromagnetic waves at high frequencies in and above the millimeter wave band.

DESCRIPTION OF THE INVENTION

Figure 1:
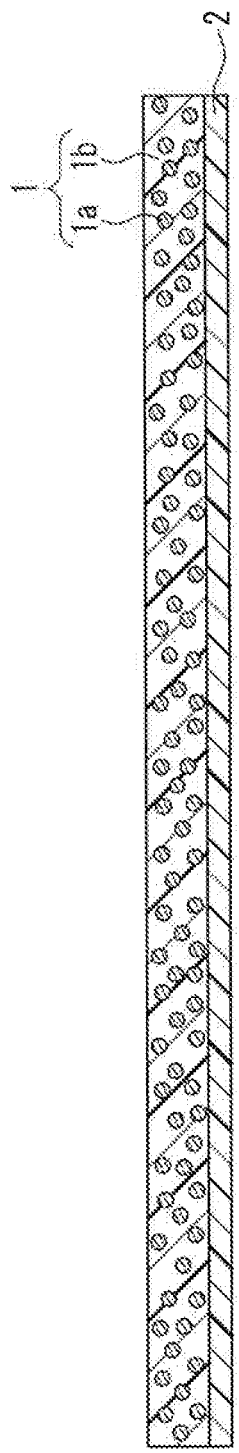
FIG. 1 is a cross-sectional view illustrating the configuration of an electromagnetic wave absorbing sheet of an embodiment.

An electromagnetic wave absorbing sheet of the present disclosure includes an electromagnetic wave absorbing layer containing a magnetic iron oxide that magnetically resonates at high frequencies in and above the millimeter wave band and a resin binder. The electromagnetic wave absorbing sheet absorbs radiated electromagnetic waves by magnetic resonance of the magnetic iron oxide. The electromagnetic wave absorbing sheet has a flexibility evaluation value F ($g/mm^2$) of more than 0 and 6 or less. The flexibility evaluation value F ($g/mm^2$) is determined by measuring an applied weight (g) that is required to bend a ribbon-like electromagnetic wave absorbing sheet in the elastic deformation region so that a distance d between the inner surfaces of the ribbon-like sheet at a position L spaced 10 mm from the bent portion of the ribbon-like sheet is 10 mm, and dividing the applied weight (g) by the cross-sectional area D ($mm^2$) of the ribbon-like sheet.

With this configuration, the electromagnetic wave absorbing sheet of the present disclosure can absorb electromagnetic waves at high frequencies in and above the millimeter wave band by the magnetic resonance of the magnetic iron oxide. Moreover, due to the use of the magnetic iron oxide and the resin binder, the electromagnetic wave absorbing sheet has a flexibility evaluation value F ($g/mm^2$) of more than 0 and 6 or less, and thus can be significantly bent without causing plastic deformation. The flexibility evaluation value F ($g/mm^2$) is determined by measuring an applied weight (g) that is required to bend a ribbon-like electromagnetic wave absorbing sheet in the elastic deformation region so that a distance d between the inner surfaces of the ribbon-like sheet at a position L spaced 10 mm from the bent portion of the ribbon-like sheet is 10 mm, and dividing the applied weight (g) by the cross-sectional area D ($mm^2$) of the ribbon-like sheet. Consequently, even if the electromagnetic wave absorbing sheet is placed on a curved surface of, e.g., the inner or outer surface of an equipment case that houses the electronic circuits to be protected, or if the electromagnetic wave absorbing sheet is very distorted, e.g., during the rearrangement, the electromagnetic wave absorbing layer is not easily cracked or fractured, so that the electromagnetic wave absorbing sheet can be highly flexible and have resistance to plastic deformation.

In the electromagnetic wave absorbing sheet of the present disclosure, the glass transition temperature (Tg) of the resin binder is preferably 0° C. or less. This allows the electromagnetic wave absorbing sheet to have sufficient flexibility for practical use.

The flexibility evaluation value F is preferably 1.5 or more and 3.5 or less. This makes the electromagnetic wave absorbing sheet highly practicable because it can achieve both ease of handling (i.e., self-supporting properties), which helps the user to carry the electromagnetic wave absorbing sheet, and high adaptability (flexibility) to the shape of the place where the electromagnetic wave absorbing sheet is to be arranged, while maintaining the electromagnetic wave absorption performance at high frequencies in and above the millimeter wave band.

In the electromagnetic wave absorbing sheet of the present disclosure, it is preferable that the content of the magnetic iron oxide in the electromagnetic wave absorbing layer is 30% by volume or more, and the content of all inorganic filler powders, including the magnetic iron oxide, present in the binder in the electromagnetic wave absorbing layer is 50% by volume or less. With this configuration, the electromagnetic wave absorbing sheet can have high electromagnetic wave absorption properties and high flexibility.

The magnetic iron oxide is preferably an epsilon iron oxide powder. The epsilon iron oxide has the largest coercive force of all metal oxides, while the natural magnetic resonance frequency is several tens of GHz or higher. The electromagnetic wave absorbing sheet of the present disclosure uses the epsilon iron oxide as an electromagnetic wave absorbing material that absorbs electromagnetic waves and thus can absorb electromagnetic waves at high frequencies in and above the millimeter wave band from 30 GHz to 300 GHz.

In this case, the epsilon iron oxide powder is preferably a powder of the epsilon iron oxide in which a part of the Fe site is substituted with a trivalent metal element. The magnetic resonance frequency of the epsilon iron oxide varies depending on the material that substitutes for the Fe site. By making use of these properties, the electromagnetic wave absorbing sheet can absorb electromagnetic waves in the desired frequency band.

It is preferable that an adhesive layer is formed on the back side of the electromagnetic wave absorbing layer. With this configuration, the electromagnetic wave absorbing sheet can have high electromagnetic wave absorption properties and excellent handleability so that it can easily be placed in a desired location.

In the electromagnetic wave absorbing sheet of the present disclosure, it is preferable that a reflective layer is formed in contact with one surface of the electromagnetic wave absorbing layer to reflect electromagnetic waves that have passed through the electromagnetic wave absorbing layer. This ensures that shielding and absorption of electromagnetic waves at frequencies in and above the millimeter wave band can be performed simultaneously. Thus, a so-called reflection-type electromagnetic wave absorbing sheet can be provided.

It is further preferable that an adhesive layer is formed on the back side of a laminated body of the electromagnetic wave absorbing layer and the reflective layer. With this configuration, the reflection-type electromagnetic wave absorbing sheet can have high electromagnetic wave absorption properties and excellent handleability so that it can easily be placed in a desired location.

Hereinafter, the electromagnetic wave absorbing sheet of the present disclosure will be described with reference to the drawings.

Embodiment

[Sheet Configuration]

FIG. 1 is a cross-sectional view illustrating the configuration of an electromagnetic wave absorbing sheet of an embodiment.

FIG. 1 is illustrated to facilitate the understanding of the configuration of the electromagnetic wave absorbing sheet of this embodiment, and does not necessarily reflect the actual size or thickness of each member in the figure.

The electromagnetic wave absorbing sheet of this embodiment includes an electromagnetic wave absorbing layer 1 containing a magnetic iron oxide 1a and a resin binder 1b. As illustrated in FIG. 1, the electromagnetic wave absorbing sheet also includes an adhesive layer 2. The adhesive layer 2 is formed on the back side (i.e., the lower surface in FIG. 1) of the electromagnetic wave absorbing layer 1. The adhesive layer 2 allows the electromagnetic wave absorbing sheet to be attached to a predetermined location such as the inner or outer surface of a case of electronic equipment.

The electromagnetic wave absorbing sheet of this embodiment converts electromagnetic waves into heat energy and dissipates it due to magnetic loss that is caused by magnetic resonance of the magnetic iron oxide 1a contained in the electromagnetic wave absorbing layer 1. Therefore, electromagnetic waves can be absorbed only by the electromagnetic wave absorbing layer 1. Thus, the electromagnetic wave absorbing sheet may be used as a so-called transmission-type electromagnetic wave absorbing sheet that absorbs electromagnetic waves passing though the electromagnetic wave absorbing layer 1 without the need for a reflective layer on one surface of the electromagnetic wave absorbing layer 1, as illustrated in FIG. 1.

Moreover, the resin binder 1b constitutes the electromagnetic wave absorbing layer 1, and the flexibility evaluation value F (g/mm$^2$) of the electromagnetic wave absorbing sheet in the elastic deformation region is more than 0 and 6 or less. With this configuration, the electromagnetic wave absorbing sheet can easily be attached to a curved surface or be peeled off and rearranged after it has stuck to the surface. Thus, the electromagnetic wave absorbing sheet is highly practicable. The definition and measurement method of the flexibility evaluation value F will be described in detail later.

Further, the adhesive layer 2 is formed on one surface of the electromagnetic wave absorbing layer 1. This makes it easier for the electromagnetic wave absorbing sheet to be attached to a desired location such as the surface of a member that is around the source of high-frequency electromagnetic waves. The presence of the adhesive layer 2 is not an essential requirement for the electromagnetic wave absorbing sheet of this embodiment.

[Magnetic Oxide]

In the electromagnetic wave absorbing sheet of this embodiment, the electromagnetic wave absorbing layer 1 contains the magnetic iron oxide 1a as a member for absorbing electromagnetic waves. For example, epsilon iron oxide or strontium ferrite may be suitable for the magnetic iron oxide 1a that magnetically resonates at frequencies in and above the millimeter wave band. In the electromagnetic wave absorbing sheet of this embodiment, the magnetic iron oxide 1a may be preferably a particulate matter because it is to be dispersed in the resin binder 1b.

The epsilon iron oxide ($\varepsilon$-Fe$_2$O$_3$) is a phase that appears between the alpha phase ($\alpha$-Fe$_2$O$_3$) and the gamma phase ($\gamma$-Fe$_2$O$_3$) in ferric oxide (Fe$_2$O$_3$). The epsilon iron oxide is a magnetic material that can be obtained as a single phase by a nanoparticle synthesis method combining a reverse micelle method with a sol-gel method.

The epsilon iron oxide includes fine particles of several nm to several tens of nm, and still has a coercive force of about 20 kOe at room temperature, which is the largest coercive force of all metal oxides. Moreover, the natural magnetic resonance of the epsilon iron oxide occurs due to a gyromagnetic effect based on precession at frequencies of several tens of GHz or higher, corresponding to the millimeter wave band. Therefore, the epsilon iron oxide has a great effect of absorbing electromagnetic waves at high frequencies in and above the millimeter wave band from 30 GHz to 300 GHz.

In the epsilon iron oxide, a part of the Fe site of the crystal is substituted with a trivalent metal element such as aluminum (Al), gallium (Ga), rhodium (Rh), or indium (In). This substitution can change the magnetic resonance frequency; i.e., the frequency of electromagnetic waves to be absorbed by the epsilon iron oxide when it is used as an electromagnetic wave absorbing material.

Figure 2:
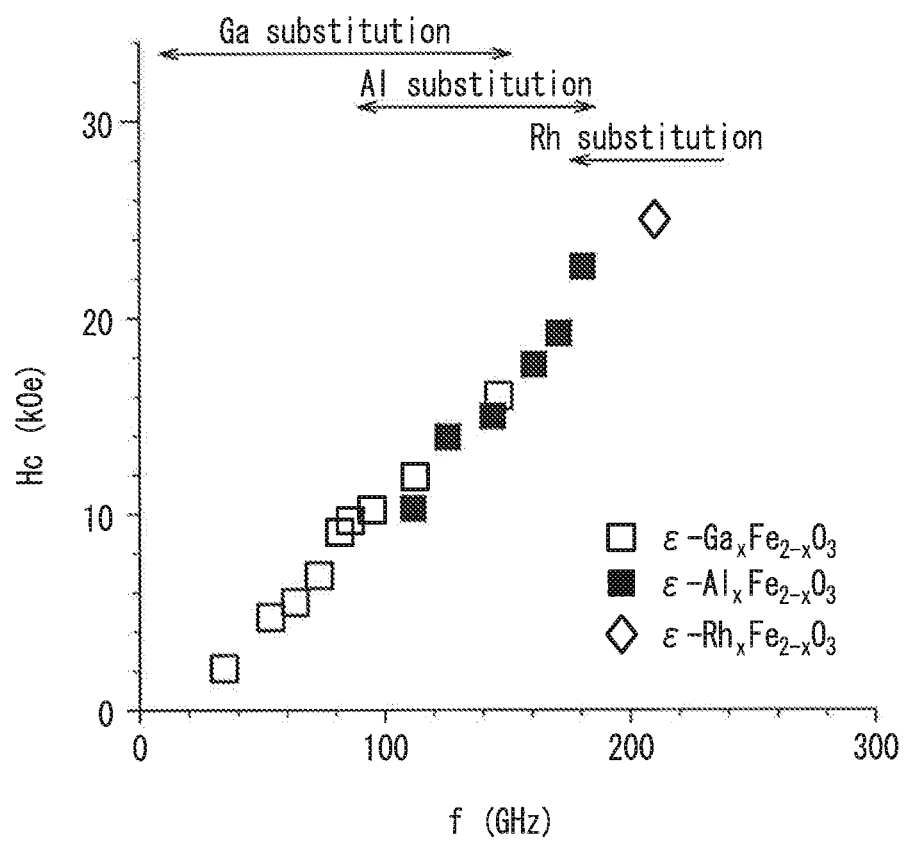
FIG. 2 is a diagram for explaining the electromagnetic wave absorption properties of an epsilon iron oxide in which a part of the Fe site is substituted.

FIG. 2 shows the relationship between the coercive force Hc and the natural resonance frequency f of the epsilon iron oxide when the metal element that substitutes for the Fe site is changed. The natural resonance frequency f substantially coincides with the frequency of electromagnetic waves to be absorbed.

It is evident from FIG. 2 that the natural resonance frequency of the epsilon iron oxide in which a part of the Fe site is substituted with a metal element varies depending on the type of the metal element and the substitution amount, and that the coercive force of the epsilon iron oxide increases with an increase in the natural resonance frequency.

More specifically, the gallium-substituted epsilon iron oxide ($\varepsilon$-Ga$_x$Fe$_{2-x}$O$_3$) has an absorption peak in a frequency band from about 30 GHz to 150 GHz by adjusting the substitution amount "x". The aluminum-substituted epsilon iron oxide ($\varepsilon$-Al$_x$Fe$_{2-x}$O$_3$) has an absorption peak in a frequency band from about 100 GHz to 190 GHz by adjusting the substitution amount "x". Therefore, the frequency of electromagnetic waves to be absorbed can be set to a desired value by selecting the type of the element that substitutes for the Fe site of the epsilon iron oxide and further adjusting the substitution amount of Fe so that the natural resonance frequency of the epsilon iron oxide will be the absorption frequency of the electromagnetic wave absorbing sheet. Moreover, the use of the rhodium-substituted epsilon iron oxide ($\varepsilon$-Rh$_x$Fe$_{2-x}$O$_3$) can shift the frequency band of electromagnetic waves to be absorbed to 180 GHz or higher.

Epsilon iron oxides, including those in which a part of the Fe site is substituted with metal, are on the market and easily available.

The oxide magnetic material 1a contained in the electromagnetic wave absorbing layer 1 of the electromagnetic wave absorbing sheet of this embodiment may be strontium ferrite. The strontium ferrite is a composite oxide of strontium and iron and is commonly used as a magnet material. The strontium ferrite has a hexagonal crystal structure with a size of about several μm. The strontium ferrite magnetically resonates with electromagnetic waves at frequencies of several tens of GHz and can absorb the electromagnetic waves.

[Resin Binder]

The resin binder $1b$ contained in the electromagnetic wave absorbing layer 1 may be a resin material such as epoxy resin, polyester resin, polyurethane resin, acrylic resin, phenol resin, melamine resin, or rubber resin.

More specifically, examples of the epoxy resin include a compound obtained by epoxidation of hydroxyl groups at both ends of bisphenol A. Examples of the polyurethane resin include polyester urethane resin, polyether urethane resin, polycarbonate urethane resin, and epoxy urethane resin. Examples of the acrylic resin include a functional group containing methacrylic polymer obtained by copolymerization of alkyl acrylate and/or alkyl methacrylate, both of which are methacrylic resin having an alkyl group with 2 to 18 carbon atoms, and a functional group containing monomer, and optionally other modifying monomers copolymerizable with them.

Examples of the rubber resin used as a binder include the following: styrene-based thermoplastic elastomers such as SIS (styrene-isoprene block copolymer) and SBS (styrene-butadiene block copolymer); petroleum synthetic rubber such as EPDM (ethylene-propylene-diene-rubber); and other rubber materials such as acrylic rubber and silicone rubber.

Among these various resins, the polyester resin is preferred because of its high flexibility. In terms of environmental protection, the resin used as a binder is preferably free of halogen. i.e., a halogen-free resin. The above resin materials are common materials for binders of resin sheets, and thus are easily available.

In this embodiment, the flexibility evaluation value F ($g/mm^2$) of the electromagnetic wave absorbing sheet in the elastic deformation region is more than 0 and 6 or less. To achieve such flexibility of the electromagnetic wave absorbing sheet, the glass transition temperature (Tg) of the binder material is 0 degrees (Celsius) or less, and more preferably −5 degrees or less.

In general, the glass transition temperature of a resin material containing a metal powder or iron oxide is likely to be higher than that of a resin material alone, which does not contain a metal powder. Therefore, as in the case of the electromagnetic wave absorbing sheet of this embodiment, when the electromagnetic wave absorbing layer contains a predetermined amount (e.g., 30% by volume) or more of the magnetic iron oxide such as an epsilon iron oxide powder or a strontium ferrite powder present in the resin binder, the glass transition temperature of the resin binder should be within the above range in order to ensure the flexibility of the electromagnetic wave absorbing sheet during actual use. Thus, the electromagnetic wave absorbing sheet can have good flexibility.

In this embodiment, the glass transition temperature (Tg) is determined in the following manner. A sample of 2 mm (width)×20 mm (length) is prepared. The thickness of the sample is measured with a micrometer. Then, using Rheogel-E4000 (product name) manufactured by UBM, the sample is measured with a tensile jig (measurement jig) under the conditions that the temperature is in the range of −70° C. to 20° C., the rate of temperature rise is 3° C./min, and the frequency is 10 Hz.

[Electromagnetic Wave Absorbing Layer]

In the electromagnetic wave absorbing sheet of this embodiment, the electromagnetic wave absorbing layer 1 contains the magnetic iron oxide $1a$ as an electromagnetic wave absorbing material. The magnetic iron oxide $1a$ includes fine metal oxide particles with a particle size of several nm to several μm such as an epsilon iron oxide powder or a strontium ferrite powder. Thus, it is important to adequately disperse the magnetic iron oxide $1a$ in the binder $1b$ during the formation of the electromagnetic wave absorbing layer 1.

For this reason, the electromagnetic wave absorbing layer 1 contains a phosphate compound. Examples of the phosphate compound include the following: arylsulfonic acids such as phenylphosphonic acid and phenylphosphonic dichloride; alkylphosphonic acids such as methylphosphonic acid, ethylphosphonic acid, octylphosphonic acid, and propylphosphonic acid; and polyfunctional phosphonic acids such as hydroxyethanediphosphonic acid and nitrotris methylenephosphonic acid. Since these phosphate compounds are flame-retardant and function as a dispersing agent for the fine magnetic iron oxide $1a$, the magnetic iron oxide $1a$ can be adequately dispersed in the binder.

Specifically, the dispersing agent may be, e.g., phenylphosphonic acid (PPA) manufactured by FUJIFILM Wako Pure Chemical Corporation or Nissan Chemical Corporation, or oxidized phosphoric acid ester "JP-502" (product name) manufactured by JOHOKIU CHEMICAL CO., LTD.

As an example, the electromagnetic wave absorbing layer 1 may be composed of 2 to 50 parts of the resin binder and 0.1 to 15 parts of the phosphate compound with respect to 100 parts of the epsilon iron oxide powder. If the content of the resin binder is less than 2 parts, the epsilon iron oxide powder cannot be well dispersed, and the shape of the electromagnetic wave absorbing sheet cannot be maintained. If the content of the resin binder is more than 50 parts, the volume content of the epsilon iron oxide powder in the electromagnetic wave absorbing sheet is reduced and magnetic permeability becomes low, so that the electromagnetic wave absorption effect is reduced.

If the content of the phosphate compound is less than 0.1 parts the magnetic iron oxide cannot be well dispersed in the resin binder. If the content of the phosphate compound is more than 15 parts, the effect of adequately dispersing the magnetic iron oxide becomes saturated. The volume content of the magnetic iron oxide in the electromagnetic wave absorbing sheet is reduced and magnetic permeability becomes low, so that the electromagnetic wave absorption effect is reduced.

When the content of the resin binder and the content of the phosphate compound are set within the above ranges, respectively it is possible to improve the dispersibility of the epsilon iron oxide powder and to reduce the maximum particle size or the average particle size. Consequently the electromagnetic wave absorbing sheet can have higher flexibility

[Method for Producing Electromagnetic Wave Absorbing Layer]

Hereinafter, an example of a method for producing the electromagnetic wave absorbing layer 1 of the electromagnetic wave absorbing sheet of this embodiment will be described. In the method, a magnetic coating material containing at least the magnetic iron oxide $1a$ and the resin binder $1b$ is prepared. The magnetic coating material is applied in a predetermined thickness, dried, and then calendered to form the electromagnetic wave absorbing layer 1. The following example uses an epsilon iron oxide powder as the magnetic iron oxide $1a$.

First, the magnetic coating material is prepared.

The epsilon iron oxide powder, the phosphate compound (dispersing agent), and the resin binder are mixed and kneaded. The resultant kneaded material is diluted, further dispersed, and then filtered through a filter, thus providing the magnetic coating material. The kneaded material may be obtained, e.g., by kneading the above mixture with a pressure batch kneader. The kneaded material may be dispersed, e.g., with a sand mill that is filled with beads such as zirconia to form a dispersion liquid. In this case, a crosslinking agent may be added as needed.

The magnetic coating material thus prepared is applied to a support having releasability by using a table coater, a bar coater, or the like. The support may be, e.g., a polyethylene terephthalate (PET) sheet that has a thickness of 38 μm and is treated with a silicone coating.

Then, the magnetic coating material in the wet state is dried at 80° C. and further calendered at a predetermined temperature with a calendar. Thus, an electromagnetic wave absorbing layer is formed on the support.

For example, the thickness of the magnetic coating material may be 1 mm when it is applied in a wet state to the support. In this case, the magnetic coating material has a thickness of 400 μm after drying, and the electromagnetic wave absorbing layer has a thickness of 300 μm after calendering.

In this manner, the electromagnetic wave absorbing layer 1 can be formed in which the nano-order fine epsilon iron oxide (the magnetic oxide 1*a*) is adequately dispersed in the resin binder 1*b*.

There is another method for preparing the magnetic coating material. The components of a magnetic coating material including at least the magnetic iron oxide, the phosphate compound (dispersing agent), and the resin binder may be mixed at a high speed with a high-speed stirrer. The resultant mixture may be subjected to a dispersion treatment with a sand mill, thus providing the magnetic coating material.

[Adhesive Layer]

As illustrated in FIG. 1, the electromagnetic wave absorbing sheet of this embodiment includes the adhesive layer 2 that is formed on the back side of the electromagnetic wave absorbing layer 1.

The adhesive layer 2 allows the electromagnetic wave absorbing layer 1 to be attached to a desired position of, e.g., the inner surface of a case that houses electric circuits or the inner or outer surface of electrical equipment. In particular, since the electromagnetic wave absorbing layer 1 has flexibility, the electromagnetic wave absorbing sheet of this embodiment can also easily be attached to a curved surface due to the presence of the adhesive layer 2. This can improve the ease of handling of the electromagnetic wave absorbing sheet.

The adhesive layer 2 may be made of any known materials used for adhesive layers of adhesive tapes or the like, including. e.g., an acrylic adhesive, a rubber adhesive, and a silicone adhesive. Moreover, a tackifier or a crosslinking agent may also be used to adjust the adhesion force to the adherend or to reduce the adhesive residue. The adhesion force to the adherend is preferably 5 N/10 mm to 12 N/10 mm. If the adhesion force is less than 5 N/10 mm, the electromagnetic wave absorbing sheet is likely to be peeled off or displaced from the adherend. If the adhesion force is more than 12 N/10 mm, the electromagnetic wave absorbing sheet is not likely to be peeled off the adherend.

The thickness of the adhesive layer 2 is preferably 20 μm to 100 μm. If the thickness of the adhesive layer is less than 20 μm, the adhesion force is reduced, and thus the electromagnetic wave absorbing sheet is likely to be peeled off or displaced from the adherend. If the thickness of the adhesive layer is more than 100 μm, the flexibility of the whole electromagnetic wave absorbing sheet may be reduced. Moreover, if the thickness of the adhesive layer 2 is large, the electromagnetic wave absorbing sheet is not likely to be peeled off the adherend. Further, if the cohesion of the adhesive layer 2 is small, an adhesive residue may be left on the adherend after the electromagnetic wave absorbing sheet is removed.

In the present specification, the adhesive layer 2 may be removably or unremovably attached to the adherend.

The electromagnetic wave absorbing sheet may be attached to a predetermined surface even without the adhesive layer 2. For example, by imparting adhesion to the surface of a member to which the electromagnetic wave absorbing sheet adheres or by using a double-sided adhesive tape or an adhesive, the electromagnetic wave absorbing sheet can be attached to a predetermined location. In this regard, it is clear that the adhesive layer 2 is not an essential component of the electromagnetic wave absorbing sheet of this embodiment.

[Flexibility of Electromagnetic Wave Absorbing Sheet]

Next, the flexibility of the electromagnetic wave absorbing sheet of this embodiment will be described. In the following description, an electromagnetic wave absorbing sheet that does not include the adhesive layer 2, but only includes the electromagnetic wave absorbing layer 1 is used as a measuring object.

Figure 3:
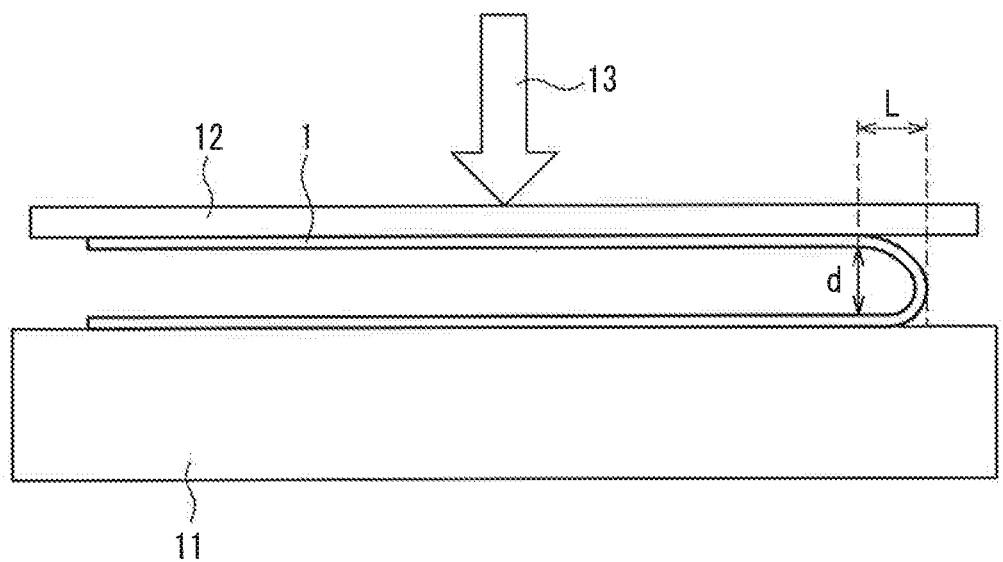
FIG. 3 is a model diagram for explaining a measurement method of a flexibility characteristic value F based on the magnitude of a weight applied to a sheet when the sheet is bent.

FIG. 3 is a diagram for explaining the measurement of a flexibility evaluation value F that indicates the degree of flexibility of the electromagnetic wave absorbing sheet of this embodiment.

The electromagnetic wave absorbing sheet in the form of a ribbon with a length of 100 mm and a width of 20 mm is used for the measurement. As illustrated in FIG. 3, the ribbon-like electromagnetic wave absorbing sheet is folded lengthwise in the middle so that both ends in the longitudinal direction of the sheet overlap each other. Then, an external force required to maintain this state is determined. Further, the external force is divided by the cross-sectional area of the electromagnetic wave absorbing sheet to give the flexibility evaluation value F of the electromagnetic wave absorbing sheet.

For example, as illustrated in FIG. 3, the electromagnetic wave absorbing sheet to be measured is placed on a measurement stand 11 of an electronic balance, and a self weight of the electromagnetic wave absorbing sheet is measured while no external force is applied. Next, a weight added to the electronic balance is measured when an external force is applied to deform the electromagnetic wave absorbing sheet. The self weight of the electromagnetic wave absorbing sheet is subtracted from the measurement result to find the applied weight that is required to maintain the folded state of the electromagnetic wave absorbing sheet.

A plate member 12 is located on the upper side of the electromagnetic wave absorbing sheet so that the electromagnetic wave absorbing sheet remains in the predetermined folded state, as illustrated in FIG. 3. An external force is applied vertically downward to the plate member 12, as indicated by the white arrow 13 in FIG. 3. Then, the magnitude of the external force 13 is measured as a weight when a distance d between the inner surfaces of the folded sheet at a position spaced L (10 mm) from the outer edge of the bent portion of the electromagnetic wave absorbing sheet 1 is 10 mm. The measured weight is divided by the cross-sectional area D (mm$^2$) of the electromagnetic wave absorbing sheet to give the flexibility evaluation value F (g/mm$^2$). The flexibility evaluation value F (g/mm$^2$) is determined at a temperature of 23° C. and a humidity of 50% Rh.

For example, the electronic balance reads 6 gw (gram-weight) when the external force 13 is applied until the electromagnetic wave absorbing sheet with a thickness of 100 μm (=0.1 mm) is brought into the state as illustrated in FIG. 3. In this case, the cross-sectional area D of the electromagnetic wave absorbing sheet is calculated by 20 (mm)×0.1 (mm)=2 (mm$^2$). Therefore, the flexibility evaluation value F is determined by 6÷2=3 (g/mm$^2$). If this flexibility evaluation value F is more than 0 and 6 or less, the electromagnetic wave absorbing sheet can be considered to have good flexibility. If the value F is more than 0 and 4 or less, the electromagnetic wave absorbing sheet is preferred because it can achieve both self-supporting properties and flexibility. If the value F is 1.5 or more and 3.5 or less, the electromagnetic wave absorbing sheet can have better flexibility.

The reason that the flexibility evaluation value F is more than 0 is as follows. If the value F is 0, the electromagnetic wave absorbing sheet is bent under its own weight, and cannot form a shape such that two parts extending from the bent portion to their respective ends are kept in parallel with each other, as illustrated in FIG. 3. This electromagnetic wave absorbing sheet becomes too soft to support its own weight. Accordingly, it is difficult to handle the electromagnetic wave absorbing sheet when the user carries it or attach it to a predetermined location. If the value F is more than 6, a large force is required to bend the electromagnetic wave absorbing sheet, which leads to poor workability.

Regarding the lower limit of the flexibility evaluation value F, the calculated value F (e.g., 0.1 or 0.01) will be "0" if it is rounded to one significant figure. However, this case should be distinguished from the case where the measured value itself is "0". As described above, the flexibility evaluation value is defined as F=0 when the electromagnetic wave absorbing sheet is bent under its own weight. If the value F is more than 0 (no matter how small it is, such as 0.01), a force should be required to press the electromagnetic wave absorbing sheet. Thus, in the present invention, the flexibility evaluation value F larger than 0 means that some external force is required to bend the electromagnetic wave absorbing sheet so that the distance d between the inner surfaces of the folded sheet at a position spaced L (10 mm) from the outer edge of the bent portion is 10 mm.

The measurement of the flexibility evaluation value F in FIG. 3 is performed based on the premise that the electromagnetic wave absorbing sheet to be measured is in the elastic deformation region. In other words, it is important that the electromagnetic wave absorbing sheet returns to its initial shape once the plate member 12 is removed after measuring the flexibility evaluation value F. If the electromagnetic wave absorbing sheet is plastically deformed under the applied external force and cannot be restored to its initial shape after the removal of the plate member 12, or if there are apparent defects such as cracks in the outer surface of the bent portion of the sheet, the electromagnetic wave absorbing sheet is regarded as not having the predetermined flexibility evaluation value.

In the initial state, when the electromagnetic wave absorbing sheet is placed on the measurement stand of the electronic balance and bent so that one end lies on top of the other, the sheet can be temporarily folded in half with both ends overlapping each other. However, if the radius of the bent portion is large, the distance d of the electromagnetic wave absorbing sheet at a position spaced L (10 mm) from the outer edge of the bent portion may be larger than 10 mm. This represents the initial shape of the electromagnetic wave absorbing sheet with relatively high flexibility. For lower flexibility, even if an attempt is made to align both ends of the electromagnetic wave absorbing sheet, they do not overlap, but are spread apart. Consequently, the distance between the inner surfaces of the sheet is greater at the end portion than at the bent portion. For much lower flexibility the electromagnetic wave absorbing sheet may return to its linear form immediately upon removal of the force that has been applied to the sheet to put one end on top of the other. Thus, in the present specification, "the electromagnetic wave absorbing sheet in the elastic deformation region" means that each electromagnetic wave absorbing sheet is in a state where it can return to its initial shape in accordance with the degree of flexibility after the external force has been removed.

Even if the electromagnetic wave absorbing sheet includes an adhesive layer and a reflective layer (as will be described later), these layers can be extremely thinner than the electromagnetic wave absorbing layer, and therefore the formation of the adhesive layer or reflective layer has a small effect on the flexibility evaluation value F.

As described above, only a slight external force is required to bend the electromagnetic wave absorbing sheet of this embodiment. At the same time, it is also important for the electromagnetic wave absorbing sheet to have high restorability so that the sheet that has been very distorted can return to its original shape when the external force is released. To achieve such high restorability, it is preferable that the average particle size of the magnetic iron oxide contained in the electromagnetic wave absorbing layer is 5 to 50 nm for epsilon iron oxide and 1 to 5 μm for strontium ferrite.

Figure 4:
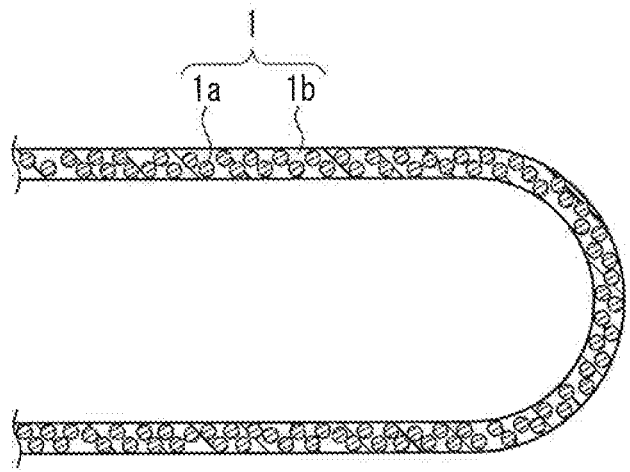
FIG. 4 is a diagram for explaining the relationship between the size of an epsilon iron oxide powder contained in an electromagnetic wave absorbing layer and the degree of bending of an electromagnetic wave absorbing sheet.
Figure 4:
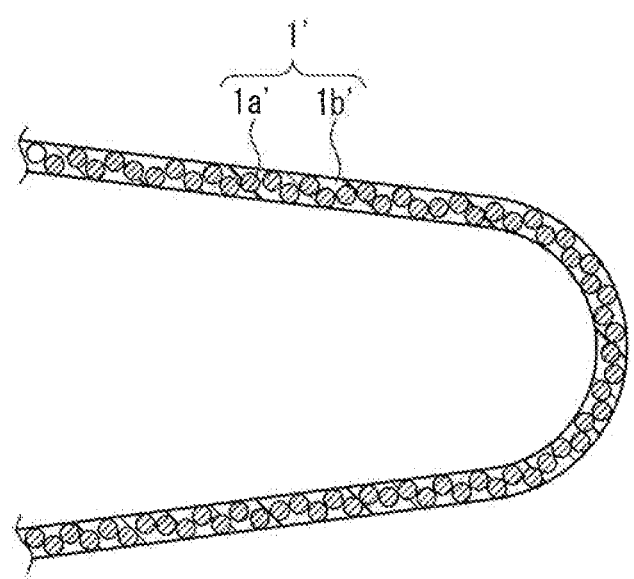

FIG. 4 is a conceptual diagram for explaining the effect of the particle size of the magnetic iron oxide contained in the electromagnetic wave absorbing layer on the flexibility of the electromagnetic wave absorbing sheet.

FIG. 4($a$) illustrates a state where the particle size of the magnetic iron oxide is sufficiently small FIG. 4($b$) illustrates a state where the particle size of the magnetic iron oxide is large. FIGS. 4($a$) and 4($b$) illustrate the shape of the electromagnetic wave absorbing sheet that is bent and pressed between two plate members to reduce the distance between the inner surfaces of the sheet in order to determine the flexibility evaluation value F, as illustrated in FIG. 3.

As illustrated in FIG. 4($a$), when the average particle size of the magnetic iron oxide 1$a$ contained in the resin binder 1$b$ is sufficiently small, the electromagnetic wave absorbing sheet (i.e., the electromagnetic wave absorbing layer 1) is smoothly curved so that two parts extending from the substantially semicircular bent portion to their respective ends form parallel lines.

On the other hand, as illustrated in FIG. 4($b$), when the particle size of a magnetic iron oxide 1$a'$ contained in a resin binder 1$b'$ is large, particles of the magnetic iron oxide come into contact with each other in the bent portion of the electromagnetic wave absorbing sheet. Thus, since the radius of the bent portion is not fully reduced, two parts extending from the bent portion to their respective ends do not form parallel lines and are spread apart at the end portion. In this state, when the force (i.e., the external force 13 in FIG. 3) is increased so that the electromagnetic wave absorbing sheet is pressed between the plate members to reduce the distance between the two ends of the sheet, the resin binder causes cracks or breakage in the bent portion, resulting in plastic deformation of the electromagnetic wave absorbing sheet (i.e., the electromagnetic wave absorbing layer 1).

FIGS. 4(*a*) and 4(*b*) are merely representations of the states of the magnetic iron oxide in the bent portion, and the ratio of the particle size of the magnetic iron oxide to the thickness of the electromagnetic wave absorbing layer differs from the actual measured value.

EXAMPLES

Next, electromagnetic wave absorbing sheets of this embodiment were actually produced and their flexibility evaluation values were measured. The results of the measurement will be described below.

The following three electromagnetic wave absorbing sheets of this embodiment were produced: an electromagnetic wave absorbing sheet in which epsilon iron oxide was used as a magnetic oxide and polyester was used as binder (Example 1); an electromagnetic wave absorbing sheet in which polyurethane was used as a binder (Example 2); and an electromagnetic wave absorbing sheet in which strontium ferrite was used as an magnetic oxide and silicone rubber was used as a binder (Example 3). In Examples 1, 2 and 3, the electromagnetic wave absorbing sheets did not include an adhesive layer, but only included an electromagnetic wave absorbing layer. The amounts of components in the composition of each electromagnetic wave absorbing sheet are as follows.

| (Example 1) | |
|---|---|
| Magnetic iron oxide | |
| Epsilon iron oxide powder | 73.1 g |
| Binder | 40.0 g |
| Polyester | |
| VYLON 55SS | |
| (product name) | |
| manufactured by | |
| TOYOBO CO., LTD. | |
| Tg: −15° C., | |
| solid content: 25.6 g, | |
| solvent : 47.5 g | |
| Phenylsulfonic acid | 2.0 g |
| (PPA: dispersing agent) | |
| Methyl ethyl ketone | 20.1 g |
| (MEK: solvent) | |

| (Example 2) | |
|---|---|
| Magnetic iron oxide | |
| Epsilon iron oxide powder | 50.6 g |
| Binder | 40.0 g |
| Polyurethane | |
| VYLON UR 8700 | |
| (product name) | |
| manufactured by | |
| TOYOBO CO., LTD. | |
| Tg: −22° C., | |
| solid content: 15.2 g, | |
| solvent: 85.4 g | |
| Phenylsulfonic acid | 2.0 g |
| (PPA: dispersing agent) | |
| Methyl ethyl ketone | 2.7 g |
| (MEK: solvent) | |

| (Example 3) | |
|---|---|
| Magnetic iron oxide | 100.0 g |
| Strontium ferrite powder | 30.0 g |
| Binder | |
| Silicone rubber | |
| KE-510U (product name) | |
| manufactured by | |
| Shin-Etsu Chemical | |
| Co., Ltd. | |
| Tg: −125° C. | |
| Curing agent | 0.9 g |
| C-8A (product name) | |
| manufactured by Shin-Etsu | |
| Chemical Co., Ltd. | |

The flexibility evaluation values F of the three electromagnetic wave absorbing sheets were measured by the method as illustrated in FIG. 3.

The electromagnetic wave absorbing sheet of Example 1, using polyester as the binder, had a flexibility evaluation value F of 1.4 (g/mm$^2$). The electromagnetic wave absorbing sheet of Example 2, using polyurethane as the binder, had a flexibility evaluation value F of 2.7 (g/mm$^2$). The electromagnetic wave absorbing sheet of Example 3, using silicone rubber as the binder, had a flexibility evaluation value F of 1.1 (g/mm$^2$). The results confirmed that all the flexibility evaluation values F fell in the range (more than 0 and 6 or less) of the flexibility evaluation value of the electromagnetic wave absorbing sheet of this embodiment.

The electromagnetic wave absorbing sheets of Examples 1 and 2 had good flexibility and were also able to absorb, e.g., electromagnetic waves at frequencies in the millimeter wave band of 75 GHz due to the use of the epsilon iron oxide as an electromagnetic wave absorbing material. Moreover, the electromagnetic wave absorbing sheet of Example 3 was also able to absorb electromagnetic waves at frequencies in the millimeter wave band of 76 GHz due to the use of the strontium ferrite as an electromagnetic wave absorbing material.

As comparative examples, the flexibility evaluation values of electromagnetic wave absorbing sheets were measured. Similarly to the electromagnetic wave absorbing sheets of Examples 1, 2, and 3, the electromagnetic wave absorbing sheets used in the comparative examples contained the epsilon iron oxide (magnetic iron oxide) and were able to absorb electromagnetic waves at high frequencies in and around the 75 GHz band. Each of the electromagnetic wave absorbing sheets of the comparative examples was a so-called electromagnetic wave interference type (λ/4 type) electromagnetic wave absorbing sheet, which absorbs electromagnetic waves by shifting the phase of reflected waves by ½ wavelength so that the reflected waves and incident waves on the electromagnetic wave absorbing sheet cancel each other out. In the first comparative example, a rubber-type electromagnetic wave absorbing sheet ("SA76" (product name) manufactured by FDK CORPORATION) was used and the flexibility evaluation value F was measured after the metal layer (reflective layer) was removed. As a result, the flexibility evaluation value F of this electromagnetic wave absorbing sheet was 8.9 (g/mm$^2$). In the second comparative example, an electromagnetic wave absorbing sheet ("EC-SORB SF-76.5 MB" (product name) manufactured by E & C Engineering K.K) was used and the flexibility evaluation value F was measured after the metal layer (reflective layer) was removed. As a result, the flexibility evaluation value F of this electromagnetic wave absorbing sheet was 7.1 (g/mm$^2$). Thus, both the existing electromagnetic wave absorbing sheets used in the comparative examples had lower flexibility than the electromagnetic wave absorbing sheets of Examples 1, 2, and 3.

To determine a preferred range of the flexibility evaluation value F, an electromagnetic wave absorbing sheet of Example 4 and an electromagnetic wave absorbing sheet of the third comparative example (Comparative Example 3) were produced by using an epsilon iron oxide powder as a magnetic iron oxide. The amounts of components in the composition of each electromagnetic wave absorbing sheet are as follows. These electromagnetic wave absorbing sheets were produced in the same manner as the electromagnetic wave absorbing sheets of Examples 1, 2, and 3.

| (Example 4) | |
|---|---|
| Magnetic iron oxide | 40.0 g |
| Epsilon iron oxide powder | 73.1 g |
| Binder | |
| Polyester | |
| VYLON 50SS | |
| (product name) | |
| manufactured by | |
| TOYOBO CO., LTD. | |
| Tg: −3° C., | |
| solid content: 15.2 g, | |
| solvent: 35.4 g | |
| Phenylsulfonic acid | 2.0 g |
| (PPA: dispersing agent) | |
| Methyl ethyl | 20.1 g |
| ketone (MEK: solvent) | |

| (Comparative Example 3) | |
|---|---|
| Magnetic iron oxide | 40.0 g |
| Epsilon iron oxide powder | 50.6 g |
| Binder | |
| Polyurethane | |
| VYLON UR 3200 | |
| (product name) | |
| manufactured by | |
| TOYOBO CO., LTD. | |
| Tg: 4° C., | |
| solid. content: 15.2 g, | |
| solvent: 35.4 g | |
| Phenylsulfonic acid | 2.0 g |
| (PPA: dispersing agent) | |

The electromagnetic wave absorbing sheet of Example 4 had a flexibility evaluation value F of 3.8 (g/mm$^2$). This electromagnetic wave absorbing sheet returned to its initial shape upon removal of the external force after finishing the measurement of the flexibility evaluation value F. On the other hand, the electromagnetic wave absorbing sheet of Comparative Example 3 had a flexibility evaluation value F of 6.3 (g/mm$^2$). When an external force was applied to this electromagnetic wave absorbing sheet, the radius of the bent portion was not readily reduced. After the flexibility evaluation value F was measured as the distance d of the electromagnetic wave absorbing sheet at a position spaced L (10 mm) from the outer edge of the bent portion was 10 mm, cracks were observed in the surface of the electromagnetic wave absorbing layer 1 on the outside of the bent portion.

The above results confirmed that the electromagnetic wave absorbing sheets with a flexibility evaluation value F of 1 or more and 4 or less had both sufficient flexibility and self-supporting properties. If the flexibility evaluation value F was more than 6, the repulsion of the electromagnetic wave absorbing sheet was too large. Therefore, the electromagnetic wave absorbing layer might be damaged when the electromagnetic wave absorbing sheet was very distorted, e.g., during the rearrangement of the sheet.

In the electromagnetic wave absorbing sheets of Examples 1, 2 and 4 and Comparative Example 3, the blending ratio of the epsilon iron oxide powder to the binder material was determined so that the content of the epsilon iron oxide in the finished electromagnetic wave absorbing layer was about 40% by volume. Moreover, in the electromagnetic wave absorbing sheet of Example 3, the blending ratio of the strontium iron oxide powder to the binder material was determined so that the content of the strontium ferrite in the finished electromagnetic wave absorbing layer was about 40% by volume.

The electromagnetic wave absorbing sheet of this embodiment absorbs incident electromagnetic waves by magnetic resonance of the magnetic iron oxide contained in the electromagnetic wave absorbing layer. Thus, the electromagnetic wave absorption properties are reduced with decreasing the content of the magnetic iron oxide in the electromagnetic wave absorbing layer. If the intensity of the transmitted waves through the electromagnetic wave absorbing sheet is reduced by 15 dB relative to the intensity of the incident waves, the electromagnetic wave absorbing sheet absorbs 90% of electromagnetic waves. To achieve the electromagnetic wave absorbing sheet having such electromagnetic wave absorption properties, the content of the magnetic iron oxide in the electromagnetic wave absorbing layer should be at least 40% by volume, which can be used as a reference. When the content of the magnetic iron oxide is 40% by volume or more, the value of the imaginary part ($\mu''$) of magnetic permeability of the electromagnetic wave absorbing layer is increased, and thus the electromagnetic wave absorbing sheet can have high electromagnetic wave absorption properties.

On the other hand, the flexibility of the electromagnetic wave absorbing sheet is reduced with increasing the filler powder components contained in the electromagnetic wave absorbing layer. The filler powder components include, e.g., the magnetic iron oxide and an inorganic filler present in the binder material. Studies conducted by the present inventors showed that if the content of all inorganic filler powders is more than 50% by volume, the flexibility may not be sufficient for the electromagnetic wave absorbing sheet. Needless to say, the degree of flexibility of the electromagnetic wave absorbing layer varies depending on the size or shape of the inorganic filler powders. Moreover, as the content of the magnetic iron oxide increases, the electromagnetic wave absorption properties are improved. Thus, it is preferable that the electromagnetic wave absorbing layer is formed so as not to include a solid content such as a filler other than the magnetic iron oxide.

[Modified Example of Electromagnetic Wave Absorbing Sheet]

Hereinafter, a modified example of the electromagnetic wave absorbing sheet of this embodiment will be described.

The electromagnetic wave absorbing sheet of the present disclosure absorbs electromagnetic waves by magnetic resonance of the magnetic iron oxide. The magnetic iron oxide is used as an electromagnetic wave absorbing material and constitutes, along with the resin binder, the electromagnetic wave absorbing layer. Thus, the electromagnetic wave absorbing sheet may include a reflective layer (e.g., a metal layer) that reflects electromagnetic waves. The reflective layer may be provided on the surface of the electromagnetic wave absorbing layer that is on the opposite side to the surface on which electromagnetic waves are incident.

Figure 5:
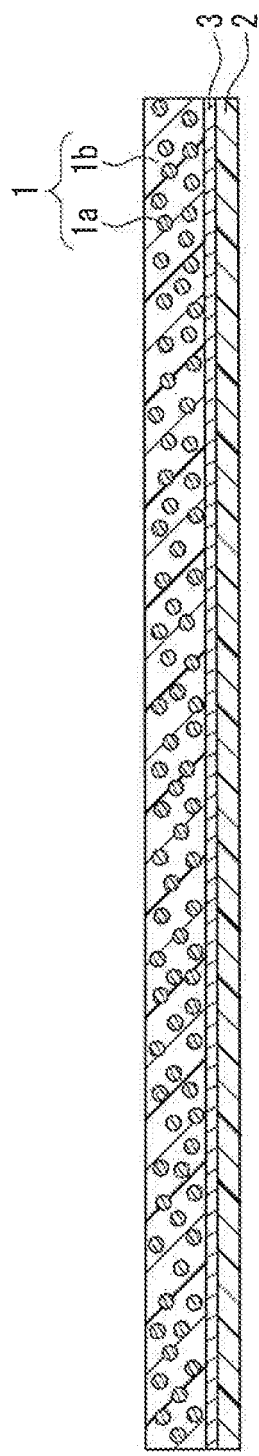
FIG. 5 is a cross-sectional view illustrating the configuration of a reflection-type electromagnetic wave absorbing sheet, which is a modified example of the electromagnetic wave absorbing sheet of this embodiment.

FIG. 5 is a cross-sectional view illustrating a modified example of the configuration of the electromagnetic wave absorbing layer of this embodiment.

Like FIG. 1 illustrating the configuration of the electromagnetic wave absorbing sheet of this embodiment, FIG. 5 is illustrated to facilitate the understanding of the configuration of the electromagnetic wave absorbing sheet, and does not necessarily reflect the actual size or thickness of each member in the figure. The members corresponding to those illustrated in FIG. 1 are denoted by the same reference numerals, and the detailed explanation will not be repeated.

The electromagnetic wave absorbing sheet of the modified example includes the electromagnetic wave absorbing layer 1 containing the magnetic iron oxide 1a and the resin binder 1b. The magnetic iron oxide 1a magnetically resonates at frequencies in and above the millimeter wave band. The electromagnetic wave absorbing sheet also includes a reflective layer 3. The reflective layer 3 is formed on the back side (i.e., the lower surface in FIG. 5) of the electromagnetic wave absorbing layer 1 and is in contact with the surface of the electromagnetic wave absorbing layer 1.

As illustrated in FIG. 5, the electromagnetic wave absorbing sheet of the modified example further includes the adhesive layer 2. The adhesive layer 2 is formed on the back side of the reflective layer 3. The adhesive layer 2 allows the electromagnetic wave absorbing sheet to be attached to a predetermined location.

The reflective layer 3 may be a metal layer that is formed in close contact with the back side of the electromagnetic wave absorbing layer 1. However, since the flexibility evaluation value F of the electromagnetic wave absorbing sheet in the elastic deformation region is more than 0 and 6 or less, it is difficult to use a metal plate as the reflective layer 3. Therefore, the reflective layer 3 may be provided as any of the following: a metal foil that is disposed in close contact with the back side of the electromagnetic wave absorbing layer 1; a metal deposited film that is deposited on the back side of the electromagnetic wave absorbing layer 1; and a metal deposited film that is formed on the surface of a non-metal sheet member (e.g., a resin) that faces the electromagnetic wave absorbing layer 1, the non-metal sheet member being located on the back side of the electromagnetic wave absorbing layer 1.

The type of metal of the reflective layer 3 is not particularly limited, and various metal materials may be used, including the metal materials generally used for electronic components or the like such as aluminum, copper, and chromium. It is more preferable that the reflective layer 3 is made of metal with the lowest possible electrical resistance and high corrosion resistance.

In the electromagnetic wave absorbing sheet of the modified example of FIG. 5, the formation of the reflective layer 3 on the back side of the electromagnetic wave absorbing layer 1 can reliably prevent electromagnetic waves from passing through the electromagnetic wave absorbing sheet. Therefore, the electromagnetic wave absorbing sheet of the modified example is particularly suitable for the prevention of leakage electromagnetic waves emitted from, e.g., electric circuit components driven at a high frequency to the outside.

As described above, the electromagnetic wave absorbing sheet of this embodiment can adequately absorb electromagnetic waves at high frequencies in and above the millimeter wave band by magnetic resonance of the magnetic iron oxide that is used as an electromagnetic wave absorbing material and contained in the electromagnetic wave absorbing layer. Moreover, since the flexibility evaluation value F of the electromagnetic wave absorbing sheet in the elastic deformation region is more than 0 (g/mm$^2$) and 6 (g/mm$^2$) or less, the electromagnetic wave absorbing sheet has flexibility high enough for practical use. Thus, the electromagnetic wave absorbing sheet can easily be attached to a curved surface and does not cause breakage or plastic deformation even if it is very distorted, e.g., during the attachment or rearrangement of the sheet.

In the above description of this embodiment, the magnetic coating material is prepared, applied and then dried to form the electromagnetic wave absorbing layer. The production method of the electromagnetic wave absorbing layer is not limited to this method for applying the magnetic coating material, and various forming processes such as extrusion may be used.

More specifically, a magnetic iron oxide powder and a binder, and optionally a dispersing agent, are blended in advance. The blend is supplied through a resin feed opening of an extruder into a plastic cylinder. The extruder may be a common extruder that includes a plastic cylinder, a die provided at the end of the plastic cylinder, a screw rotatably provided in the plastic cylinder, and a drive mechanism for driving the screw. Then, the blend is plasticized by a band heater of the extruder, and the molten material is fed forward by the rotation of the screw and forced through the die to produce a sheet-like material. The extruded material is dried, formed under pressure, calendered, etc., thus providing the electromagnetic wave absorbing layer with a predetermined thickness.

In the electromagnetic wave absorbing sheet of this embodiment, the electromagnetic wave absorbing layer is a single layer. However, the electromagnetic wave absorbing layer may be a laminated body of a plurality of layers. This configuration is particularly useful for a reflection-type electromagnetic wave absorbing sheet including a reflective layer, since the input impedance of the electromagnetic wave absorbing layer can be controlled to a desired value which is matched to the impedance of the air. Thus, the electromagnetic wave absorption properties of the electromagnetic wave absorbing sheet can be further improved.

INDUSTRIAL APPLICABILITY

The electromagnetic wave absorbing sheet of the present disclosure is useful as an electromagnetic wave absorbing sheet that absorbs electromagnetic waves at high frequencies in and above the millimeter wave band and has high flexibility.

DESCRIPTION OF REFERENCE NUMERALS

1 Electromagnetic wave absorbing layer
1a Magnetic iron oxide
1b Binder
2 Adhesive layer

The invention claimed is:

1. An electromagnetic wave absorbing sheet comprising:
an electromagnetic wave absorbing layer containing a magnetic iron oxide that magnetically resonates at frequencies in and above a millimeter wave band and a resin binder,
wherein a glass transition temperature (Tg) of the resin binder is 0° C. or less,
a content of the magnetic iron oxide in the electromagnetic wave absorbing layer is 30% by volume or more, and
a content of all inorganic filler powders, including the magnetic iron oxide, present in the binder in the electromagnetic wave absorbing layer is 50% by volume or less.

2. The electromagnetic wave absorbing sheet according to claim 1, wherein the magnetic iron oxide is an epsilon iron oxide powder and/or a strontium ferrite powder.

3. The electromagnetic wave absorbing sheet according to claim 1 or 2, wherein an adhesive layer is formed on a back side of the electromagnetic wave absorbing layer.

* * * * *